United States Patent [19]

Matsunaga et al.

[11] Patent Number: 5,763,139
[45] Date of Patent: Jun. 9, 1998

[54] PLASMA DISPLAY PANEL AND METHOD FOR MANUFACTURING THE SAME

[75] Inventors: Koji Matsunaga; Masaru Yoshida, both of Katano; Takayuki Nagahara; Takao Inoue, both of Hirakata; Junji Ikeda, Ikoma, all of Japan

[73] Assignee: Matsushita Electric Industrial Co., Ltd., Osaka-fu, Japan

[21] Appl. No.: 592,679

[22] Filed: Jan. 26, 1996

[30] Foreign Application Priority Data

Jan. 26, 1995 [JP] Japan .................. 7-010584

[51] Int. Cl.$^6$ .................................................. G03C 5/00
[52] U.S. Cl. .................. 430/313; 430/311; 430/312; 430/319; 313/485; 313/564; 313/610; 313/611; 345/60; 345/65; 345/70; 348/797; 445/24
[58] Field of Search .................. 430/313, 311, 430/312, 319; 313/485, 564, 610, 611; 345/60, 65, 70; 348/797; 445/24

[56] References Cited

U.S. PATENT DOCUMENTS 5,182,489  1/1993  Sano ........................... 313/485
5,368,991  11/1994  Uchikawa et al. ........... 430/288

*Primary Examiner*—Mark Chapman
*Attorney, Agent, or Firm*—Wenderoth, Lind & Ponack, L.L.P.

[57] ABSTRACT

A plasma display panel includes a light-transmittable first substrate, a plurality of first electrodes provided in correspondence with pixels on the first substrate and partition walls provided on the first substrate so that each of the partition walls surrounds at least a part of one of the first electrodes. A Fluorescent layer is formed at a portion surrounded by the partition wall where the first electrode is located in such a manner that the first electrode surrounded by the partition wall is exposed by curing and baking a fluorescent ink having a photo-setting resin and an illuminant as its main ingredients. A light-transmittable second substrate is arranged in contact with the partition wall oppositely to the first substrate, and light-transmittable or opaque second electrodes are arranged on the second substrate oppositely to the first electrodes.

35 Claims, 4 Drawing Sheets

PLASMA DISPLAY PANEL AND METHOD FOR MANUFACTURING THE SAME

BACKGROUND OF THE INVENTION

The present invention relates to a plasma display panel for use in a color plasma display device and a method for manufacturing the same.

In recent years, there has been a growing demand for large-size flat display devices with color presentation capabilities in the fields of office automation, audio and video industries, and so forth. Such large-size flat color display devices include a color plasma display.

A DC type color plasma display panel includes a light-transmittable substrate, lower electrodes formed on the substrate in correspondence with pixels of the panel, and partition walls formed so as to surround surfaces of the lower electrodes. The partitions can be formed so that they completely surround the lower electrodes or they can be formed in a groove-like form so as to only partially surround the lower electrodes on two sides. A fluorescent layer is formed inside the partition walls while allowing the lower electrodes to remain exposed. A light-transmittable upper substrate is arranged so that it covers the elements of the panel. Upper electrodes are formed on the upper substrate so as to correspond to the lower electrodes.

The partition walls are formed as follows. First, a glass paste having a low melting point including, for example, alumina powder is coated to a thickness of about 20 μm on the lower substrate by the known screen printing method. The above process is repeated ten or more times to form a glass layer having a thickness of about 200 μm. The formed glass layer is coated with a resist capable of withstanding a sand blast. The resist is then abraded so that the lower electrodes are exposed by the sand-blasting, thereby forming the partition walls. Sand-blasting is a method for blasting inorganic powder such as glass particles against the glass layer.

The fluorescent layer is formed as follows. First, a fluorescent ink, made by dispersing a fluorescent material in a resin binder such as cellulose, is inserted by a screen printing method into an area on the lower substrate that is surrounded by the partition walls. The above process is performed for three colors: red, green, and blue. Thereafter, a solvent component included in the resin binder is evaporated at a temperature of not lower than 100° C. for drying. After completing the drying process, the dried fluorescent ink on the lower electrodes is removed by sand-blasting, thereby exposing the lower electrodes. Finally, the resultant is baked at a temperature of not lower than 500° C. so as to remove the resin binder component of the fluorescent ink to leave only the fluorescent material, so that a fluorescent layer is formed inside the partition walls.

According to this conventional manufacturing method for forming the partition walls by sand-blasting, it is required to coat the glass paste ten or more times. Furthermore, prior to sand-blasting to remove the fluorescent material from the electrodes, the partition walls must be coated with a resist capable of withstanding the sand blast. These processes require considerable time for the formation of the partition walls. Furthermore, there is a danger that the lower electrodes will be abraded away, causing a point defect in the form of an unlit dot.

Moreover, according to the conventional manufacturing method for removing the fluorescent layer by sand-blasting, there is a danger that the removed fluorescent material of one color will adhere to the fluorescent material of another color causing a point defect manifested as a fluorescent color mixture. Furthermore, similarly to the case of the partition walls, there is a danger that the lower electrodes will be abraded away causing a point defect in the form of an unlit dot.

SUMMARY OF THE INVENTION

Accordingly, it is an object of the present invention to provide a plasma display panel and a method for manufacturing the same wherein the display quality of the panel is improved and the possibility of the occurrence of point defects is reduced.

Another object of the present invention is to provide a plasma display panel and a method for manufacturing the same which are capable of reducing the time necessary for forming the partition walls.

In accomplishing these and other objects, according to a first aspect of the present invention, there is provided a plasma display panel that includes a light-transmittable first substrate, a plurality of first electrodes provided on the first substrate in correspondence with pixels of the panel, and partition walls provided on the first substrate surrounding at least a part of one of the first electrodes. The panel also includes a fluorescent layer formed in a portion surrounded by the partition walls. However, the first electrode surrounded by the partition wall is exposed, i.e., it is not covered by the fluorescent layer. The fluorescent layer is formed by curing and baking a fluorescent ink having a photo-setting resin and an illuminant as its main ingredients. A light-transmittable second substrate is arranged in contact with the partition wall opposite to the first substrate. Light-transmittable or opaque second electrodes are arranged on the second substrate opposite to the first electrodes.

According to a second aspect of the present invention, the partition walls are formed by curing and baking a photo-setting type ink that has a photo-setting resin and glass powder or ceramic powder as its main ingredients. At least one of the partition walls is provided on the first substrate so that the partition wall surrounds at least part of one of the first electrodes.

According to a third aspect of the present invention, there is provided a plasma display panel manufacturing method which includes an ink supplying process for supplying a fluorescent ink, including an illuminant, a photo-setting resin, and a solvent, at a portion of the panel that is surrounded by the partition wall. The method also includes an ink drying process for drying the fluorescent ink thereby evaporating the solvent and a light irradiating process for applying light to the fluorescent ink. A developing process is then used to remove an unexposed portion of the fluorescent ink to which light has not been applied, thereby forming a fluorescent ink layer at the portion surrounded by the partition wall which allows the electrode to be exposed. Finally, the method includes a baking process for baking the substrate on which the fluorescent ink layer is formed, thereby removing the photo-setting resin and forming a fluorescent layer.

According to a fourth aspect of the present invention, the ink supplying process supplies a fluorescent ink that includes an ultraviolet ray emitting type illuminant and a photo-setting resin. The ink does not include a solvent. The manufacturing method includes a light irradiating process, a developing process, and a baking process. However, since there is no solvent, a drying process is not required.

According to a fifth aspect of the present invention, there is provided a plasma display panel manufacturing method which includes a partition wall forming process for forming a partition wall around at least part of one of a plurality of opaque electrodes on a light-transmittable substrate. The electrodes correspond to pixels of the panel. The walls are formed with a photo-setting type ink having glass powder or ceramic powder as its main ingredient by multistage exposure. The method also includes a fluorescent layer forming process for forming a fluorescent layer on a portion of the panel that is surrounded by the partition wall.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
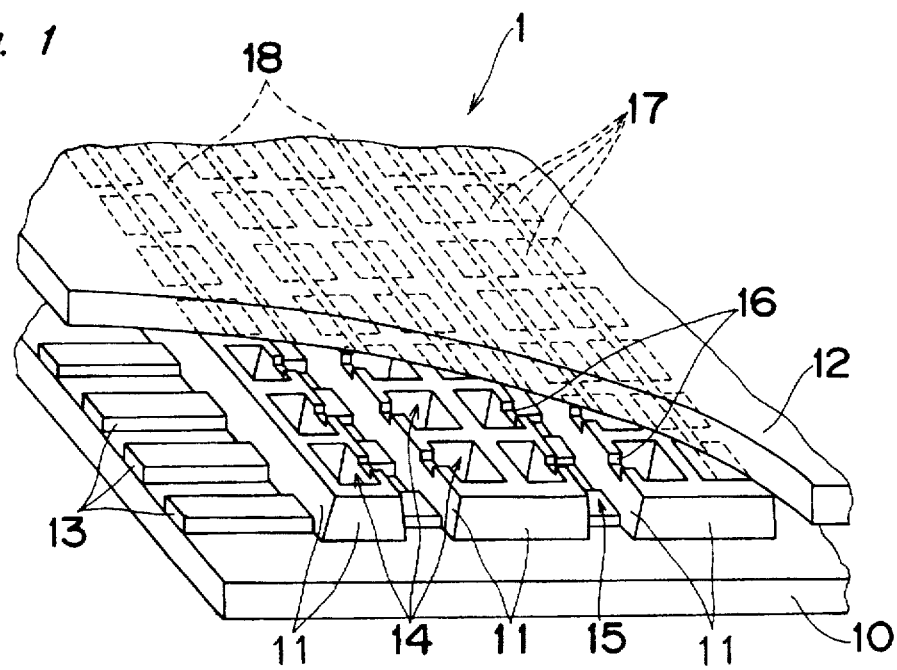
FIG. 1 is a perspective view of a part of a plasma display panel according to an embodiment of the present invention.

Before the description of the present invention proceeds, it is to be noted that like parts are designated by like reference numerals throughout the accompanying drawings.

FIG. 1 is a perspective view of a part of a plasma display panel 1 (referred to as a PDP hereinafter) according to an embodiment of the present invention.

In FIG. 1, the PDP 1 includes a lower substrate 10 made of a light-transmittable glass, partition walls 11 on the lower substrate 10 so as to correspond with pixels of the panel and an upper substrate 12 made of a light-transmittable glass. The upper substrate is tightly bonded onto the partition walls 11. The lower substrate 10 is arranged on the back side of the PDP 1 and has a cathode 13 formed thereon. As shown in FIG. 1 the cathode includes strips which are arranged at intervals. The partition walls 11 form display cells 14. Auxiliary cells 15 are formed between the partition walls 11. Priming spaces are formed in the partition walls 11 between the auxiliary cells and the display cells so as to guide electric charges generated from the auxiliary cells 15 to the display cells 14. Display anodes 17 are formed on the upper substrate 12 in positions opposite to the display cells 14, while auxiliary anodes 18 are formed in positions opposite to the auxiliary cells 15.

Figure 2:
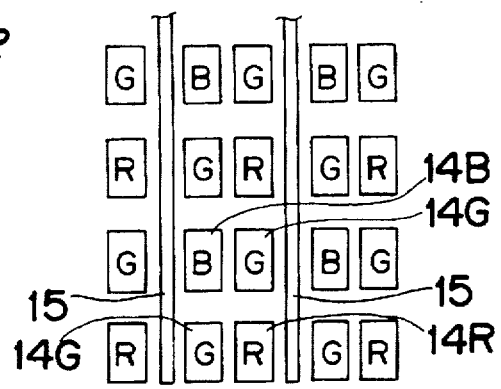
FIG. 2 is a schematic plan view showing an arrangement of display cells of the panel.

As shown in FIG. 2, four display cells 14B, 14G, 14G, and 14R are arranged in a matrix form so that they constitute one pixel. Two green cells 14G are arranged diagonally with respect to each other, and a blue cell 14B and a red cell 14R are arranged diagonally with respect to each other.

Figure 3:
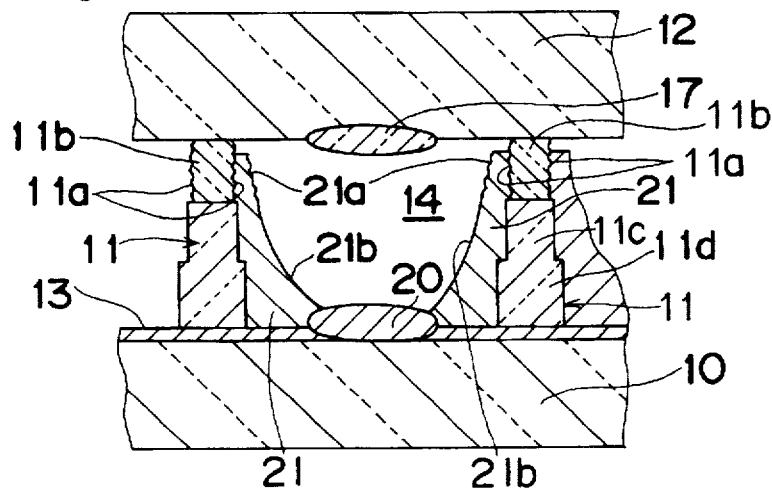
FIG. 3 is an enlarged sectional view showing the construction of the display cell.

In each of the display cells 14 is formed an electrode 20 on the cathode 13 as shown in FIG. 3. Further, in each display cell 14, a fluorescent layer 21 is formed on the interior surfaces of the partition walls 11. The fluorescent layer 21 is formed in such a manner that the electrode 20 remains exposed, i.e., the electrode is not covered by the fluorescent layer.

The fluorescent layer 21 is formed by curing and baking a fluorescent ink having an ultraviolet (UV) emitting type fluorescent material, a UV curing type acrylic resin, and a solvent as its main ingredients. The electrode 20 is formed of a metal (e.g., Ag) which is opaque. The display anode 17 is formed of a metal compound (e.g., indium tin oxide) and is light transmittable.

The partition walls 11 have a height of about 200 μm, and are formed by coating, in three layers, a UV curing type ink, and exposing and developing the ink. The ink includes glass powder or ceramic powder and a UV curing type resin as its main ingredients. The glass powder included in an upper layer 11b of the partition wall 11 has a particle diameter greater than those included in a middle layer 11c and a lower layer 11d of the partition wall 11. The larger particle diameter allows corrugated surfaces 11a to be formed on the sides of the upper layer 11b.

The upper portion of the inner peripheral surface of the fluorescent layer 21 takes the form of an irregular reflection surface 21a because it is deposited on the corrugated surface 11a of the upper layer 11b of the partition walls 11. The irregular reflection surface 21a extends downwardly into a regular reflection surface 21b that has a U-shaped sectional configuration.

A manufacturing procedure of the PDP 1 will be described next.

First, the cathodes 13 are formed on the lower substrate 10 and the electrodes 20 are formed on the cathodes 13. Likewise, the display anodes 17 and the auxiliary anodes 18 are formed on the upper substrate 12. In addition, electrodes (not shown) for connecting the anodes 17 are formed on the upper substrate.

Figure 4A:
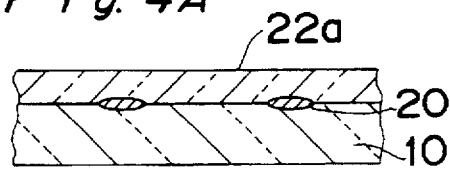
FIGS. 4A, 4B, 4C, 4D, 4E, 4F, 4G, 4H, and 4I, are schematic sectional views showing a partition wall forming procedure of a method for manufacturing a plasma display panel according to an embodiment of the present invention.
Figure 4F:
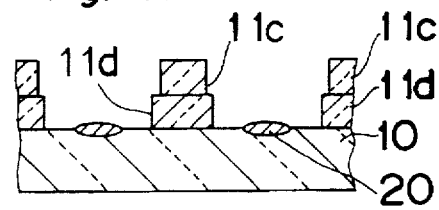
Figure 4B:
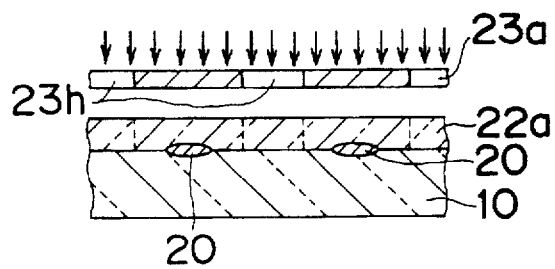

Subsequently, as shown in FIG. 4A, a UV curing type ink 22a which serves as the lower layer 11d of the partition walls 11 is coated by a known screen printing method or the like. As described above, the UV curing type ink 22a includes, as its main ingredients, glass powder or ceramic powder and a photo-setting type resin such as a UV curing type acrylic resin. A mask 23a having holes 23h for allowing light to pass therethrough is placed above the lower substrate 10 so that light is applied only to portions that are to be formed into the partition walls 11. Then the UV curing type ink 22a is exposed to light (FIG. 4B). When the exposure is completed, a developing process for solving, i.e., dissolving, and removing the uncured acrylic resin is performed using pure water or an alkaline solution (FIG. 4C). Consequently, the lower layers 11d of the partition walls 11 are formed. One example of a UV curing type acrylic resin is a resin that includes ethylene glycol dimethacrylate as its main ingredient. The exposure is performed at 20 mj/cm². As the developing solution, 0.2 wt % solution of sodium carbonate ($Na_2CO_3$) can be used. Alternatively, an inorganic alkaline solution such as KOH or an organic alkaline solution such as a tetramethyl hydroxide-ammonium solution, which is generally used as a developing solution in a semiconductor manufacturing process, can be used as the developing solution.

Figure 4G:
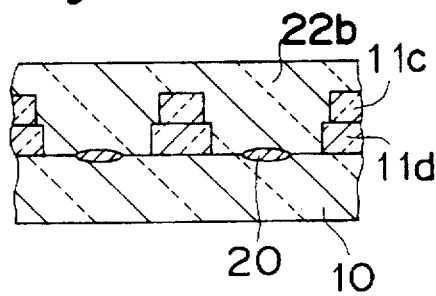
Figure 4C:
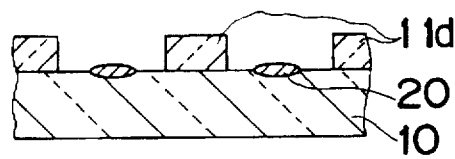
Figure 4H:
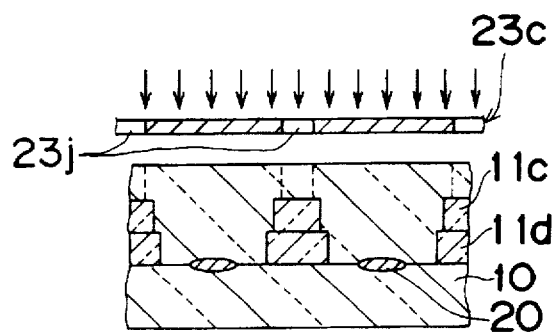
Figure 4D:
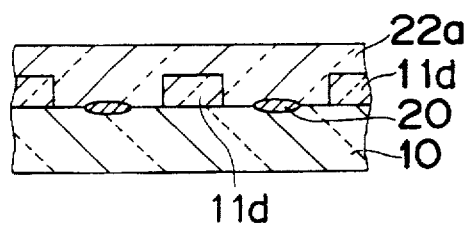
Figure 4E:
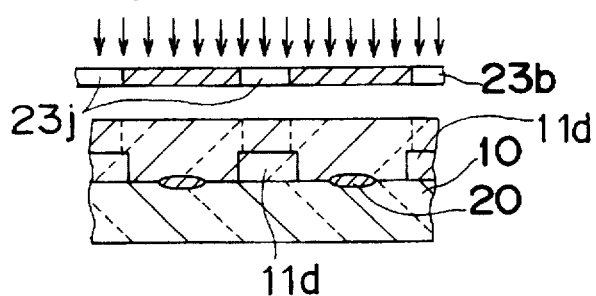

For the middle layers, the UV curing type ink 22a having the same components as the ink of the lower layers is coated on the lower layers 11d by a known screen printing method (FIG. 4D). Then, exposure is performed by placing a mask 23b, having holes 23i which allow light to pass therethrough, above the lower substrate 10 (FIG. 4E). The holes 23i of the mask 23b have an exposure width smaller than the holes 23h of the mask 23a. The above arrangement is adopted so as to reduce the thickness of the partition walls 11 toward the top of the walls. In the same manner as above, a developing process for dissolving and removing the uncured acrylic resin is performed using pure water or an alkaline solution (FIG. 4F). Consequently, the middle layers 11c of the partition walls 11 are formed.

Figure 4I:
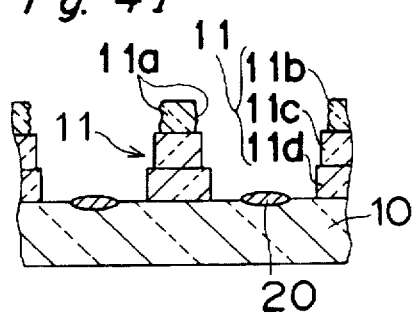

For the upper layers, a different UV curing type ink 22b is deposited (FIG. 4G). The UV curing type ink 22b includes glass powder or ceramic powder having a particle diameter greater than that of the UV curing type ink 22a. Exposure is then performed by placing a mask 23c, having holes 23j which allow light to pass therethrough, above the lower substrate 10 (FIG. 4H). The holes 23j of the mask 23c have an exposure width far smaller than the holes 23i of the mask 23b. A developing process for removing the uncured acrylic resin is performed using pure water or an alkaline solution (FIG. 4I). Thus, the upper layers 11b of the partition walls 11 are formed. The upper layers 11b of the partition walls 11 are made using powder having larger particle diameters, and therefore the surfaces 11a which are formed on the side surfaces are corrugated. Furthermore, the holes 23h, 23i, and 23j of the masks 23a through 23c are made to have gradually reduced exposure widths, and therefore the partition walls 11 become thinner toward the top of the walls.

Figure 5A:
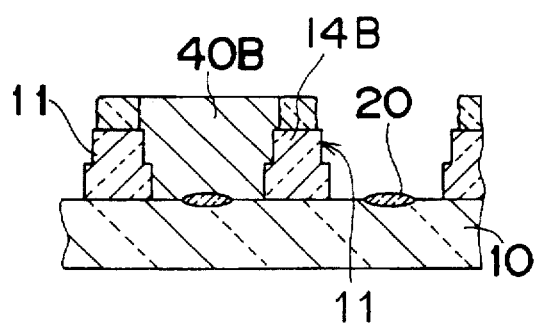
FIGS. 5A, 5B, 5C, 5D, 5E, 5F, and 5G are schematic sectional views showing a fluorescent layer forming procedure of the method according to an embodiment of the present invention.
Figure 5E:
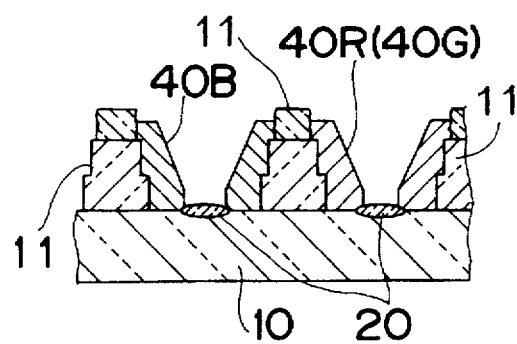
Figure 5B:
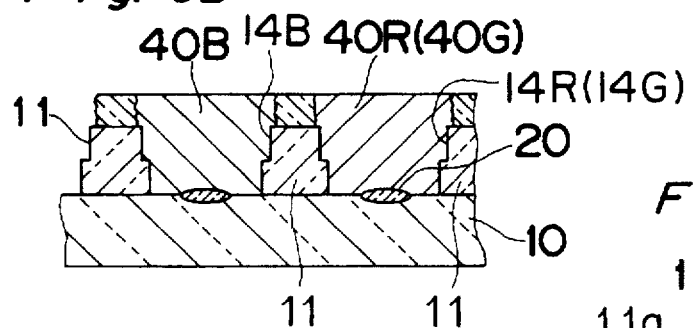

After the partition walls 11 are formed, a fluorescent layer 21 is formed on the display cell 14 inside the partition walls 11. In forming the fluorescent layer 21, as shown in FIG. 5A for example, a blue fluorescent ink 40B is injected into the display cell 14 by a known screen printing method or the like. The blue fluorescent ink 40B is obtained by mixing, for example, 50 parts by weight of a blue fluorescent material with 50 parts by weight of a UV curing type acrylic resin, and dissolving the resulting mixture in no less than 50 parts by weight of a solvent (e.g., butyl carbitol). For the blue fluorescent material, for example, $BaMgAl_{14}O_{23}:Eu^{2+}$ is used. Further, for the UV curing type acrylic resin, it is preferred to use a material obtained by adding a polymerization initiator to a water soluble UV curing type acrylic resin. The polymerization initiator has a polymerization initiating function even at a wavelength greater than or equal to 350 nm. After such a blue fluorescent ink 40B is injected into the display cell 14B, the green and red fluorescent inks 40G and 40R are injected into the display cells 14G and 14R, respectively (FIG. 5B). In this case, for example, $Zn_2SiO_4:Mn$ is used for the green fluorescent material, while $YBO_3:Eu$ is used for the red fluorescent material. For the UV curing type acrylic resins of the red and green inks, the same material as that of the blue color is used. For the green color, 55 parts by weight of the green fluorescent material and 45 parts by weight of the UV curing type acrylic resin are used. For the red color, 60 parts by weight of the red fluorescent material and 40 parts by weight of the UV Curing type acrylic resin are used. In the same manner as above, each of the resulting mixtures is dissolved using no less than 50 parts by weight of a solvent.

Figure 5F:
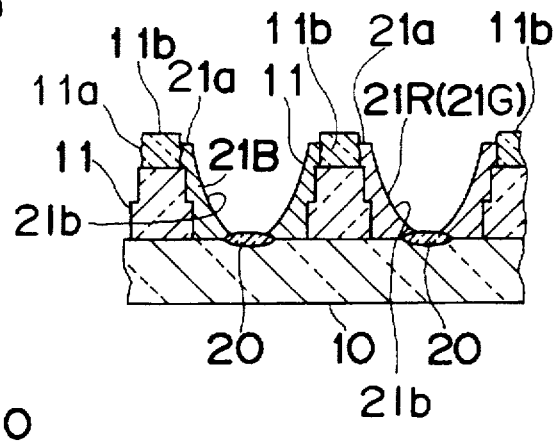
Figure 5C:
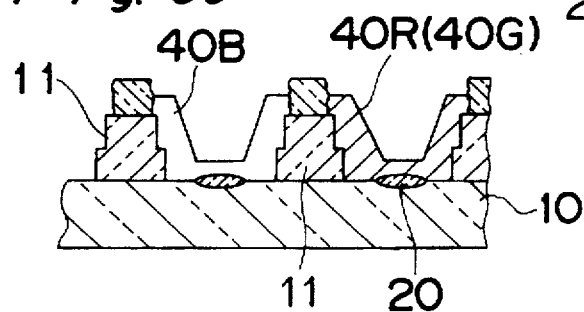
Figure 5D:
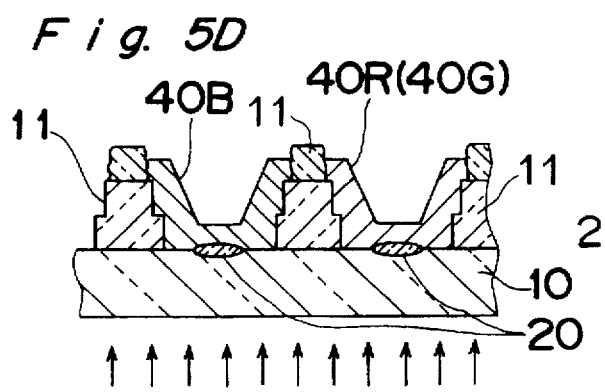
Figure 5G:
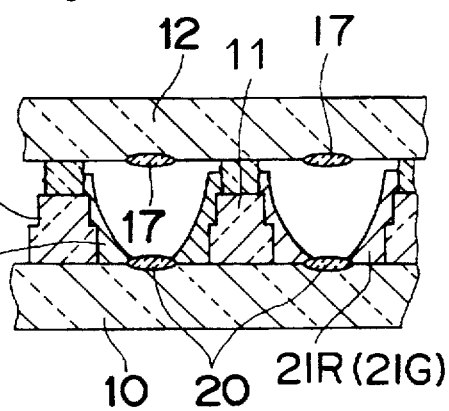

The mixed solvent is then evaporated by heating the substrate 10 at a temperature of about 100° C. Consequently, the fluorescent ink 40B (40R and 40G) is dried and assumes a concave shape (FIG. 5C). Then, light is applied from below the bottom surface of the lower substrate 10. The light is shielded by the electrode 20, so that the resin located above the electrode 20 is not cured, and only the resin located along the partition walls 11 is cured (FIG. 5D). After the exposure is completed, a developing process for removing the uncured resin is performed using pure water or an alkaline solution, as shown in FIG. 5E, so that the electrode 20 is exposed. The resulting body is baked at a temperature of not lower than 500° C. for 30 minutes or more to evaporate the resin component. The baking causes the fluorescent layers 21B, 21R, and 21G to be formed on the respective interior surfaces of the partition walls 11 (FIG. 5F). The thus formed fluorescent layers 21B, 21R, and 21G are each corrugated at their upper-end inner-peripheral portions because of their deposition on the corrugated surfaces 11a of the upper layers 11b (FIG. 3). The corrugated surface of the fluorescent material constitutes an irregular reflection surface 21a. Meanwhile, in the baking process, the portion below the upper-end inner-peripheral portion assumes the shape of a smooth U-shaped curve. The smooth curve portion constitutes a regular reflection surface 21b. The exposure can be performed at, for example, 100 mj/cm². Since the light is emitted from the back surface of the substrate and the illuminance of the light is reduced through the substrate, the exposure illuminance must be greater than when the light is emitted from the upper side of the substrate.

Finally, the upper substrate 12 is bonded to the upper surfaces of the partition walls 11 via a glass sealant (not shown) which is melted by heating. The air from inside the panel is discharged and replaced with an Xe—He gas mixture.

In the present invention, a photo-setting resin is used in fabricating the partition walls 11 and the fluorescent layers 21. Therefore, in comparison with the prior art sand-blasting method, the problems of point defects due to the drop-out of the electrode 20 and/or point defects of fluorescent color mixture do not tend to occur. Furthermore, because of the irregular reflection surfaces 21a at the upper portions of the fluorescent layer 21, light emitted from the fluorescent layer 21 diffuses in every direction. Therefore, an improved display efficiency results.

The operation of the PDP 1 will be described next.

When red, blue, and green color signals having gradations are outputted from a display drive unit (not shown), specified electric charges are applied to the display anodes 17, causing an electric discharge in the Xe—He gas to emit an ultraviolet ray. In response to the ultraviolet ray, the fluorescent layer 21 corresponding to the color signal emits light. Specified threshold voltages are constantly applied to the auxiliary anodes 18. Because of the irregular reflection surfaces 21a at the upper-end inner-peripheral portion of the fluorescent layer 21, the light is dispersed in every direction. This allows improved visibility from in front of the panel as well as obliquely with respect to the panel.

Another method of the forming fluorescent layer 21 will be described next.

Figure 6A:
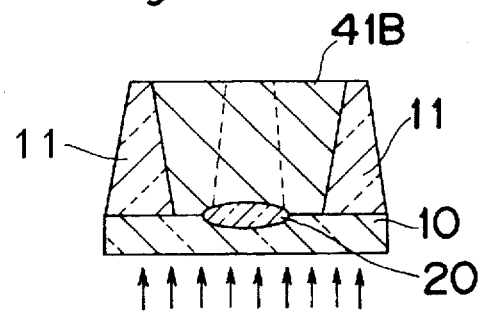
FIGS. 6A, 6B, 6C, 6D, 6E and 6F are schematic sectional views showing a fluorescent layer forming procedure of a method for manufacturing a plasma display panel according to another embodiment of the present invention.
Figure 6D:
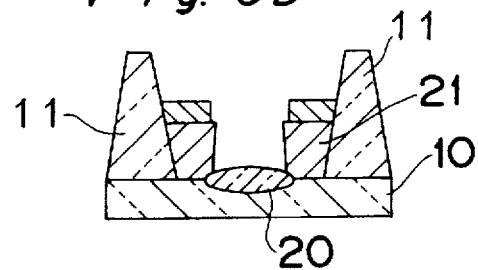
Figure 6B:
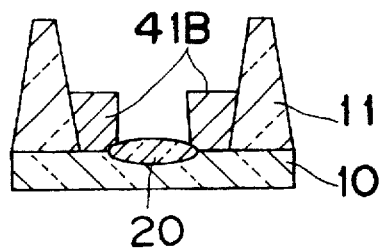
Figure 6E:
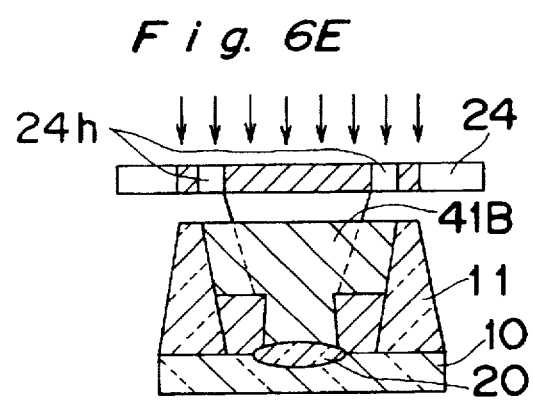
Figure 6C:
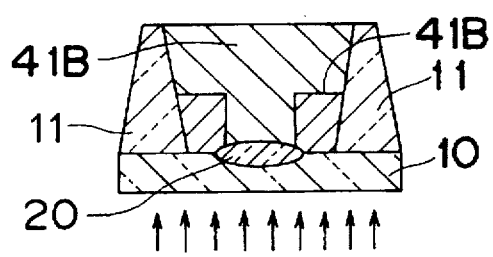
Figure 6F:
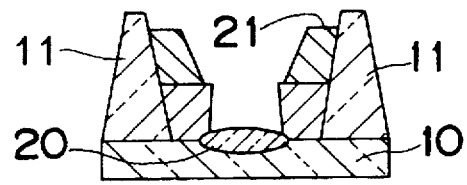

FIGS. 6A through 6F illustrate the process of forming the fluorescent layer 21 with a fluorescent ink that does not include a solvent. In FIG. 6A, a fluorescent ink 41B is injected into the display cell within the partition walls 11, and exposure light is applied from below the lower surface of the lower substrate 10. In this case, the electrode 20 serves as a mask to expose the portions of the ink, except those portions above the electrode 20, to light so as to cure the resin in the ink 41B. Subsequently, a developing process for removing the uncured resin is performed using pure water or an alkaline solution (FIG. 6B). Then, the fluorescent ink 41B is again injected into the display cell 14, and light is applied from below the lower surface of the substrate 10 for the exposure to cure the resin in the ink 41B (FIG. 6C). A developing process for removing the uncured resin is performed using pure water or an alkaline solution and then baking is effected for 30 minutes or more, so that the fluorescent layer 21 is formed (FIG. 6D). Rather than performing the second exposure from below the lower surface of the substrate 10, a mask 24 having holes 24h can be placed above the ink allowing light to be applied only to the portion of the fluorescent ink 41B along the partition walls 11 through the holes 24h as shown in FIG. 6E. When the above arrangement is adopted, the fluorescent layer 21 which is formed has a higher accuracy and closely fits the partition walls 11 as shown in FIG. 6F.

Figure 7A:
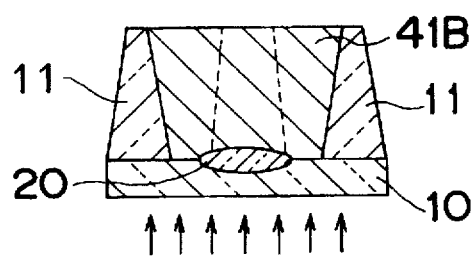
FIGS. 7A and 7B are schematic sectional views showing a fluorescent layer forming procedure of a method for manufacturing a plasma display panel according to a further embodiment of the present invention.
Figure 7B:
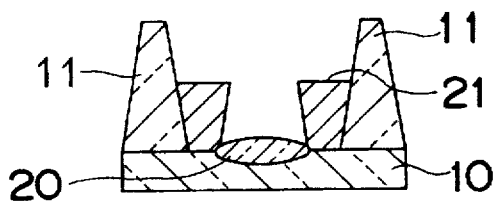

It is not strictly required that the exposure process be performed more than once. The fluorescent ink could be exposed one time only prior to the developing process, as shown in FIGS. 7A and 7B. When such an arrangement is adopted, the fluorescent layer 21 is not formed as accurately, however, the time necessary for forming the fluorescent layer 21 can be reduced.

Other Embodiments

The PDP can be formed such that only the fluorescent layer is formed using a photo-setting resin. In the alternative, the PDP can be formed such that only the partition walls are formed using a photo-setting resin. In another possible embodiment, instead of forming the partition walls around each electrode, the walls may be formed around three electrodes, e.g., the red, blue, and green electrodes for each pixel. Finally, the shape of either or both of the partition walls and the fluorescent layer can be controlled through the use of light.

In the above described embodiments, the partition wall 11 is shown as being a rectangular flat plate, but it is not limited to such a shape. For example, the partition wall can be formed as a curved surface to form a circular space surrounded by the partition wall around the electrode.

Although the photo-setting resin which is of a negative resist type is used in the above described embodiments, a resin can be used of a positive resist type in which an exposed portion of the resin is soluble in a developing solution and is removed.

In the above described embodiments, a lead glass having a melting point of 490° C. can be used as a combined glass, and in order to have an irregular reflection function, borosilicate series glasses having refractive indexes of 1.49 and 1.54 can be mixed with each other to form the irregular reflection surface. Such an irregular reflection surface can also be formed by mixing glass powders having different diameters with each other.

In the above described embodiments, instead of the pure water, water or a water solution including acid or alkaline can be used. Water is preferable because the pH of water does not change and it is therefore unnecessary to adjust the pH.

In the above described embodiments, in order to set the resin, UV light is used but a laser beam or an electron beam can be used for setting a resin which can be set by a laser beam or an electron beam.

In the plasma display panel of the present invention, when a voltage is applied to the electrodes, an electric discharge occurs in the rare gas inside the partition walls to make the fluorescent layer emit light. In this case, the fluorescent layer is formed by curing and baking the fluorescent ink including a photo-setting resin and an illuminant. Therefore, neither the point defect of an unlit dot due to the drop-out of an electrode nor a point defect of color mixture tend to occur, so that an improved image quality can be achieved.

When the fluorescent layer is formed into a U-shaped sectional configuration along the partition walls, light is efficiently emitted, thereby improving the light emitting efficiency.

When an irregular reflection surface is formed at the upper portion of the fluorescent layer, light reflected irregularly at the upper portion is emitted in every direction. Therefore the visibility in oblique directions can be improved.

When the partition walls are provided so that they increase in thickness in steps toward the substrate, the partition walls can be easily formed, and by simply forming the fluorescent layer along the partition walls, the fluorescent layer assumes a shape which assures an improved light emitting efficiency.

In the plasma display panel according to the present invention, when a voltage is applied to the electrodes, an electric discharge occurs in the rare gas inside the partition walls to make the fluorescent layer emit light. In this case, when the partition walls are formed by curing and baking the UV Curing type ink having glass powder or ceramic powder and a photo-setting resin as its main ingredients, the partition walls can be easily formed by applying light to the ink. The above arrangement obviates the need for coating the glass paste ten or more times and applying a resist. Therefore, the image quality can be improved since the time necessary for forming the partition walls can be reduced and the point defects embodied as unlit dots due to the drop-out of an electrode hardly ever occur. When the fluorescent layer is formed by curing and baking the fluorescent ink having a photo-setting resin and an ultraviolet ray emitting type illuminant as its main ingredients, the fluorescent layer can be formed without using a sand-blasting method. Therefore, an improved image quality can be achieved since neither point defects embodied as unlit dots due to the drop-out of an electrode nor point defects of color mixture tend to occur.

According to the plasma display panel manufacturing method of the present invention, opaque electrodes corresponding to the pixels of the panel are formed on the light-transmittable substrate. Then, in the partition wall forming process, partition walls are formed around the electrodes. When the partition walls are formed, the fluorescent ink, including an ultraviolet ray emitting type illuminant, a photo-setting resin, and a solvent, is supplied between the partition walls in the ink supplying process. The supplied fluorescent ink is dried in the ink drying process, so that the solvent is evaporated. During the light irradiating process, light is applied to the fluorescent ink from which the solvent has been evaporated. An unexposed portion of the fluorescent ink, to which the light has not been applied, is removed by using developing solution in the developing process. This results in a fluorescent ink layer between the partition walls which allows the electrodes to remain exposed. Then, in the baking process, the substrate with the fluorescent ink layer formed thereon is baked to remove the photo-setting resin, thereby forming a fluorescent layer. In this case, the fluorescent layer is formed without using a sand-blasting method. Therefore, an improved image quality can be achieved since neither the point defect of color mixture nor the point defect of an unlit dot due to the drop-out of an electrode tend to occur.

The benefit of irradiating the light from below the back surface of the substrate, on which the electrodes are formed, is that the electrodes serve as a mask for shielding the light, thereby obviating the need for a separate mask.

According to the plasma display panel manufacturing method of another embodiment of the present invention, opaque electrodes corresponding to the pixels on the light-transmittable substrate are formed in the electrode forming process. Then, in the partition wall forming process, partition walls are formed around the electrodes formed in the electrode forming process. When the partition walls are formed, the fluorescent ink including an ultraviolet ray emitting type illuminant and a photo-setting resin is supplied between the partition walls in the ink supplying process. The ink, however, does not contain a solvent. To the supplied fluorescent ink is applied light in the light irradiating process. An unexposed portion of the fluorescent ink to which light has not been applied is removed by a developing solution in the developing process, thereby forming a fluorescent ink layer between the partition walls so that the electrodes are exposed. Then, in the baking process, the substrate with the fluorescent ink layer formed is baked to remove the photo-setting resin, thereby forming a fluorescent layer. In this case, the fluorescent layer is formed without using a sand-blasting method. Therefore, neither the point defect of color mixture nor the point defect of an unlit dot due to the drop-out of an electrode tend to occur, so that an improved image quality can be achieved and the fluorescent layer can be formed without using any solvent.

When the fluorescent ink is supplied in two stages in the ink supplying process, the light can be irradiated from below the back surface both times. Developing is performed every time the light is irradiated. The fluorescent layer can be partially formed in each of the two stages, and therefore, the external form of the fluorescent layer can be formed with higher accuracy. Furthermore, the light is irradiated from below the back surface of the substrate while using the electrodes as a photo-mask, and therefore it is not necessary to use a separate photo-mask.

Alternatively, light can be irradiated from below the back surface of the substrate after the first stage and light can be irradiated from above the upper surface of the substrate through a photo-mask after the second stage. With this method, the fluorescent layer can be formed with higher accuracy by virtue of the photo-mask. Time can be saved by supplying the fluorescent ink only once while still performing exposure with a photo-mask from above the upper surface subsequent to an exposure from the back surface.

When the partition walls are formed at the upper layer with glass powder or ceramic powder having larger diameters than in the lower layers, simply by forming the fluorescent layer along the partition walls the upper-end inner-peripheral portion of the fluorescent layer becomes an irregular reflection surface. With this arrangement, an improved visibility can he achieved and the light emitting efficiency can be improved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma display panel comprising:
   a light-transmittable first substrate;
   a plurality of first electrodes provided on said first substrate;
   partition walls provided on said first substrate such that each of the partition walls at least partially surrounds at least one of said first electrodes, wherein said partition walls increase in thickness toward said first substrate;
   a fluorescent layer provided along at least a portion of at least one of said partition walls and between at least one of said first electrodes and said at least one of said partition walls, wherein said at least one of said first electrodes is exposed, and wherein said fluorescent layer is formed by curing and baking a fluorescent ink layer comprising a photo-setting resin and an illuminant;
   a light transmittable second substrate in contact with said partition walls and arranged oppositely to said first substrate; and
   second electrodes arranged on the second substrate oppositely to said first electrodes.

2. A plasma display panel as claimed in claim 1, wherein said partition walls increase in thickness gradually toward said first substrate.

3. A plasma display panel as claimed in claim 1, wherein said partition walls increase in thickness in steps toward said first substrate.

4. A plasma display panel as claimed in claim 1, wherein said second electrodes are opaque.

5. A plasma display panel as claimed in claim 1, wherein said second electrodes are light-transmittable.

6. A plasma display panel as claimed in claim 1, wherein said fluorescent layer has a curved cross section.

7. A plasma display panel as claimed in claim 1, wherein said fluorescent layer comprises an irregular reflection surface at an end portion thereof.

8. A plasma display panel as claimed in claim 1, wherein said partition walls are formed by curing and baking a photo-setting type ink comprising a photo-setting resin and a glass or ceramic powder.

9. A plasma display panel comprising:
   a light-transmittable first substrate;
   a plurality of first electrodes provided on said first substrate;
   partition walls provided on said first substrate such that each of the partition walls at least partially surrounds at least one of said first electrodes, wherein said partition walls increase in thickness toward said first substrate, and wherein said partition walls are formed by curing and baking a photo-setting type ink comprising a photo-setting resin and a glass powder or ceramic powder;
   a fluorescent layer provided along at least a portion of at least one of said partition walls and between at least one of said first electrodes and said at least one of said partition walls, wherein said at least one of said first electrodes is exposed;
   a light transmittable second substrate in contact with said partition walls and arranged oppositely to said first substrate; and
   second electrodes arranged on the second substrate oppositely to said first electrodes.

10. A plasma display panel as claimed in claim 9, wherein said partition walls increase in thickness gradually toward said first substrate.

11. A plasma display panel as claimed in claim 9, wherein said partition walls increase in thickness in steps toward said first substrate.

12. A plasma display panel as claimed in claim 9, wherein said second electrodes are opaque.

13. A plasma display panel as claimed in claim 9, wherein said second electrodes are light-transmittable.

14. A plasma display panel as claimed in claim 9, wherein said fluorescent layer has a curved cross section.

15. A plasma display panel as claimed in claim 9, wherein said fluorescent layer comprises an irregular reflection surface at an end portion thereof.

16. A plasma display panel as claimed in claim 9, wherein said fluorescent layer is formed by curing and baking a fluorescent ink comprising a photo-setting resin and an ultraviolet ray emitting type illuminant.

17. A plasma display panel manufacturing method comprising:

forming opaque electrodes on a light transmittable substrate;

forming partition walls such that each of the partition walls at least partially surrounds at least one of the electrodes, and such that the partition walls increase in thickness toward the substrate;

supplying a fluorescent ink, comprising an illuminant, a photo-setting resin, and a solvent, between the partition walls;

drying the fluorescent ink thereby evaporating the solvent;

applying light to the fluorescent ink;

removing an unexposed portion of the fluorescent ink, to which light has not been applied, thereby forming a fluorescent layer along at least a portion of at least one of the partition walls and between at least one of the electrodes and the at least one of the partition walls, wherein the at least one of the electrodes is exposed; and baking the fluorescent layer thereby removing the photo-setting resin therefrom.

18. A plasma display panel manufacturing method as claimed in claim 17, wherein:

the applying of light is from behind the substrate such that the opaque electrodes are between the fluorescent ink and the applied light.

19. A plasma display panel manufacturing method as claimed in claim 17, wherein:

the removing comprises utilizing a developing solution.

20. A plasma display panel manufacturing method comprising:

forming opaque electrodes on a light transmittable substrate;

forming partition walls such that each of the partition walls at least partially surrounds at least one of the electrodes, and such that the partition walls increase in thickness toward the substrate;

supplying a fluorescent ink, comprising an ultraviolet illuminant and a photo-setting resin, between the partition walls;

applying light to the fluorescent ink;

removing an unexposed portion of the fluorescent ink, to which light has not been applied, thereby forming a fluorescent layer along at least a portion of at least one of the partition walls and between at least one of the electrodes and the at least one of the partition walls, wherein the at least one of the electrodes is exposed; and baking the fluorescent layer thereby removing the photo-setting resin therefrom.

21. A plasma display panel manufacturing method as claimed in claim 20, wherein:

the supplying of fluorescent ink, applying of light to the fluorescent ink, and removing of an unexposed portion of fluorescent ink are repeated two times before the baking of the fluorescent layer; and the applying of light is from behind the substrate such that the opaque electrodes are between the fluorescent ink and the applied light.

22. A plasma display panel manufacturing method as claimed in claim 20, wherein:

the supplying of fluorescent ink, applying of light to the fluorescent ink, and removing of an unexposed portion of fluorescent ink are repeated two times before the baking of the substrate;

the applying of light is from behind the substrate, such that the opaque electrodes are between the fluorescent ink and the applied light, after the supplying of ink a first of the two times; and the applying of light is from in front of the substrate through a photo-mask, after the supplying of ink a second of the two times.

23. A plasma display panel manufacturing method as claimed in claim 20, wherein:

the applying light to the fluorescent ink comprises,
applying light from behind the substrate such that the opaque electrodes are between the fluorescent ink and the applied light, and then
applying light from in front of the substrate through a photo-mask.

24. A plasma display panel manufacturing method comprising:

forming partition walls, such that each of the partition walls at least partially surrounds at least one of a plurality of opaque electrodes on a light-transmittable substrate, with a photo-setting type ink, comprising a powder, by multistage exposure such that the partition walls increase in thickness toward the substrate; and forming a fluorescent layer along at least a portion of at least one of the partition walls and between the at least one of the plurality of opaque electrodes and the at least one of the partition walls.

25. A plasma display panel manufacturing method as claimed in claim 24, wherein:

the powder is glass powder.

26. A plasma display panel manufacturing method as claimed in claim 24, wherein:

the powder is ceramic powder.

27. A plasma display panel manufacturing method as claimed in claim 24, further comprising:

before forming the partition walls, forming the plurality of opaque electrodes on the light-transmittable substrate.

28. A plasma display panel manufacturing method as claimed in claim 24, wherein the forming of the partition walls comprises:

coating a first photo-setting type ink, comprising a photo-setting resin and a first powder, on the substrate a plurality of times;

after each coating of the first photo-setting type ink, applying ultraviolet light through a photo-mask to the first photo-setting type ink, wherein the width of the applied light is reduced after each coating of the first photo-setting type ink;

coating a second photo-setting type ink, comprising a photo-setting resin and a second powder having a particle diameter greater than that of the first powder, on the substrate; and applying ultraviolet light through a photo-mask to the second photo-setting type ink, wherein the width of the applied light is smaller than that of the light applied after the coating of the first photo-setting type ink.

29. A plasma display panel manufacturing method as claimed in claim 28 wherein the forming of the fluorescent layer further comprises:

forming the fluorescent layer along a portion of the partition wall which was formed by coating the second photo-setting type ink, thereby forming an irregular reflection surface.

30. A plasma display panel manufacturing method as claimed in claim 28, wherein:

the first powder and the second powder are glass powder.

31. A plasma display panel manufacturing method as claimed in claim 28, wherein:

the first powder and the second powder are ceramic powder.

32. A plasma display panel manufacturing method as claimed in claim 24, wherein the forming of the fluorescent layer comprises:

supplying a fluorescent ink, comprising an illuminant, a photo-setting resin, and a solvent, between the partition walls;

drying the fluorescent ink thereby evaporating the solvent;

applying light to the fluorescent ink;

removing an unexposed portion of the fluorescent ink, to which light has not been applied, thereby forming a fluorescent layer along at least a portion of at least one of the partition walls and between at least one of the electrodes and the at least one of the partition walls, wherein the at least one of the electrodes is exposed; and baking the fluorescent layer thereby removing the photo-setting resin therefrom.

33. A plasma display panel manufacturing method as claimed in claim 32, wherein:

the removing comprises utilizing a developing solution.

34. A plasma display panel manufacturing method as claimed in claim 24, wherein: the forming of the fluorescent layer comprises:

supplying a fluorescent ink, comprising an ultraviolet illuminant and a photo-setting resin, between the partition walls;

removing an unexposed portion of the fluorescent ink, to which light has not been applied, thereby forming a fluorescent layer along at least a portion of at least one of the partition walls and between at least one of the electrodes and the at least one of the partition walls, wherein the at least one of the electrodes is exposed; and baking the fluorescent layer thereby removing the photo-setting resin therefrom.

35. A plasma display panel manufacturing method as claimed in claim 34, wherein:

the removing comprises utilizing a developing solution.

* * * * *